(12) United States Patent
Merced Grafals et al.

(10) Patent No.: US 9,953,728 B2
(45) Date of Patent: Apr. 24, 2018

(54) REDUNDANT COLUMN OR ROW IN RESISTIVE RANDOM ACCESS MEMORY

(71) Applicant: Hewlett Packard Enterprise Development LP, Houston, TX (US)

(72) Inventors: Emmanuelle J Merced Grafals, Palo Alto, CA (US); Brent Buchanan, Fort Collins, CO (US); Le Zheng, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/216,589

(22) Filed: Jul. 21, 2016

(65) Prior Publication Data

US 2018/0025790 A1 Jan. 25, 2018

(51) Int. Cl.
*G11C 11/00* (2006.01)
*G11C 29/00* (2006.01)
*G11C 13/00* (2006.01)
*H01L 45/00* (2006.01)

(52) U.S. Cl.
CPC ........ *G11C 29/789* (2013.01); *G11C 13/0021* (2013.01); *H01L 45/16* (2013.01)

(58) Field of Classification Search
None
See application file for complete search history.

(56) References Cited

U.S. PATENT DOCUMENTS

| 6,477,081 | B2 | 11/2002 | Poechmueller | |
| 7,778,070 | B2 | 8/2010 | Nirschl et al. | |
| 8,643,520 | B1 * | 2/2014 | Huo | H03M 1/068 341/136 |
| 9,001,550 | B2 | 4/2015 | Lung | |
| 2014/0104924 | A1 * | 4/2014 | Sutardja | G11C 29/026 365/148 |
| 2014/0133211 | A1 * | 5/2014 | Nazarian | G11C 7/062 365/145 |
| 2016/0373108 | A1 * | 12/2016 | Morris | H03K 19/0948 |

FOREIGN PATENT DOCUMENTS

CN 102543171 7/2012

OTHER PUBLICATIONS

Demme J. et al., "Increasing Reconfigurability With Memristive Interconnects", (Research Paper), Apr. 20, 2016, 8 pages.

* cited by examiner

*Primary Examiner* — Son Dinh
*Assistant Examiner* — Uyen B Tran
(74) *Attorney, Agent, or Firm* — Trop, Pruner & Hu, P.C.

(57) ABSTRACT

Examples include a resistive random access memory (RRAM) array to support a redundant column. Some examples include an RRAM cell at a cross point of a column line and a row line of the RRAM array. A first column line may be coupled to a first input of a first current-steering multiplexer and the first current-steering multiplexer may have an output coupled to a first current sense amplifier and a select input coupled to a first column select signal. A second column line may be coupled to a second input of the first current-steering multiplexer and coupled to a first input of a second current-steering multiplexer. The second current-steering multiplexer may have an output coupled to a second current sense amplifier and a select input coupled to a second column select signal. A third column line may be coupled to a second input of the second current-steering multiplexer.

18 Claims, 5 Drawing Sheets

REDUNDANT COLUMN OR ROW IN RESISTIVE RANDOM ACCESS MEMORY

BACKGROUND

Memory manufacture and production may result in a predictable number of memory errors. Accordingly, manufacturers perform tests at various intervals in the production process to determine whether errors exist. Manufacturers may also design around or design for certain common errors.

BRIEF DESCRIPTION OF THE DRAWINGS

The following detailed description references the drawings, wherein.

DETAILED DESCRIPTION

Errors may occur during memory fabrication and production. Given that errors may occur at a fairly predictable rate, memory manufacturers may test memory at numerous stages in the fabrication and production process to check for errors. Memory manufacturers may vary deposition, removal, and patterning techniques to avoid errors. Manufacturers may also build in redundancy and/or repair mechanisms to negate or counter any common errors. For instance, manufacturers may produce memory with redundant or repair circuitry, columns, and/or arrays to compensate for any errors during manufacture.

In some examples, dynamic random access memory (DRAM) manufacturers and static random access memory (SRAM) manufacturers employ differential analog voltage signals for the bitlines of the memory array. An analog-to-digital voltage amplifier may convert these signals to single-ended digital signals, which may then enter a downstream digital multiplexer to select certain bitlines for use. However, analog-to-digital voltage amplifiers and digital multiplexers to select lines in a memory array are unworkable for resistive random access memory (RRAM), which may involve single-ended analog current signals on its column lines.

Examples described herein may support redundant columns and/or redundant rows in an RRAM array to allow for the selection of working columns and/or rows and the rejection of a faulty column or row during memory manufacture and production. For instance, examples described herein may involve column lines of an RRAM array connected to current steering multiplexers, each having an output connected to a current sense amplifier. In some such examples, a column select line at each current steering multiplexer may select a column line such that a column line of the RRAM array remains unused. In other examples described herein, row lines of an RRAM array may be connected to switches, wherein each switch is coupled to a driver. In some such examples, a row select line at each switch may select a row line such that a row line of the RRAM array remains unused.

In some examples described herein, an RRAM array to support a redundant column may comprise an RRAM cell at a cross point of a column line and a row line and a first column line coupled to a first input of a first current-steering multiplexer, in which the first current-steering multiplexer has an output coupled to a first current sense amplifier and a select input coupled to a first column select signal. The RRAM array may further comprise a second column line coupled to a second input of the first-current steering multiplexer and coupled to a first input of a second current-steering multiplexer, wherein the second current-steering multiplexer has an output coupled to a second current sense amplifier and a select input coupled to a second column select signal. The RRAM array may also comprise a third column line coupled to a second input of the second current-steering multiplexer.

In some such examples, the RRAM cell may be bipolar and the first and second current-steering multiplexers may each comprise a first n-channel field effect transistor (nFET) and a second nFET. In other such examples, the RRAM cell may be unipolar and the first and second current-steering multiplexers may each comprise a first p-channel field effect transistor (pFET) and a second pFET.

In some examples described herein, an RRAM array to support a redundant row may comprise a plurality of row lines and a plurality of column lines perpendicular to the plurality of row lines, wherein a cross point is formed at each location where a row line of the plurality of row lines crosses a column line of the plurality of column lines. The RRAM array may further comprise an RRAM cell at each cross point and a plurality of switches coupled to the plurality of row lines, wherein a first row line of the plurality of row lines is coupled to a first switch of the plurality of switches, a last row line of the plurality of row lines is coupled to a last switch of the plurality of switches, and each of a remainder of row lines of the plurality of row lines is coupled to two switches of the plurality of switches. The RRAM array may also comprise a plurality of row select signals, wherein each switch of the plurality of switches is coupled to a row select signal of the plurality of row select signals and a plurality of drivers, wherein each switch is coupled to a driver.

In other such examples described herein, the plurality of switches of the RRAM array to support a redundant row may be voltage multiplexers, the plurality of row lines may support a single-ended analog voltage signal, and the plurality of drivers may be voltage drivers. In such examples, the RRAM array may further comprise a plurality of current-steering multiplexers coupled to the plurality of column lines, wherein a first column line of the plurality of column lines is coupled to a first current-steering multiplexer of the plurality of current-steering multiplexers, a last column line of the plurality of column lines is coupled to a last current-steering multiplexer of the plurality of current-steering multiplexers, and each of a remainder of column lines of the plurality of column lines is coupled to two current-steering multiplexers of the plurality of current-steering multiplexers. The RRAM array may also comprise a plurality of column select signals, wherein each current-steering multiplexer of the plurality of current-steering multiplexers is coupled to a column select signal of the plurality of column select signals and a plurality of current sense amplifiers, wherein a bidirectional node of each current-steering multiplexer is coupled to a current sense amplifier.

In some examples described herein, a method for supporting a redundant column in an RRAM array may involve fabricating a plurality of row lines and fabricating a plurality of column lines perpendicular to the plurality of row lines, wherein the plurality of column lines has n+1 column lines and a cross point is formed at each location where a row line of the plurality of row lines crosses a column line of the plurality of column lines. The method may also involve fabricating an RRAM cell at each cross point and coupling n current-steering multiplexers to the plurality of column lines, wherein each current-steering multiplexer is coupled to two column lines of the plurality of column lines, has a select input coupled to a column select signal, and has a bidirectional node coupled to a current sense amplifier. The method may further involve identifying a failed column line. Based on the identification of the failed column line, a low column select signal may be applied at the select input of each current-steering multiplexer coupled to the column line of the plurality of column lines prior to the failed column line to select each column line of the plurality of column lines to the left of the failed column line. Based on the identification, a high column select signal at the select input of each current-steering multiplexer coupled to the column line of the plurality of column lines after the failed column line to select each column line of the plurality of column lines to the left of the failed column line to select each column line of the plurality of column lines to the right of the failed column line. In examples described herein, a determination, action, etc., that is said to be based on a given condition may be based on that condition alone or based on that condition and other condition(s).

Figure 1:
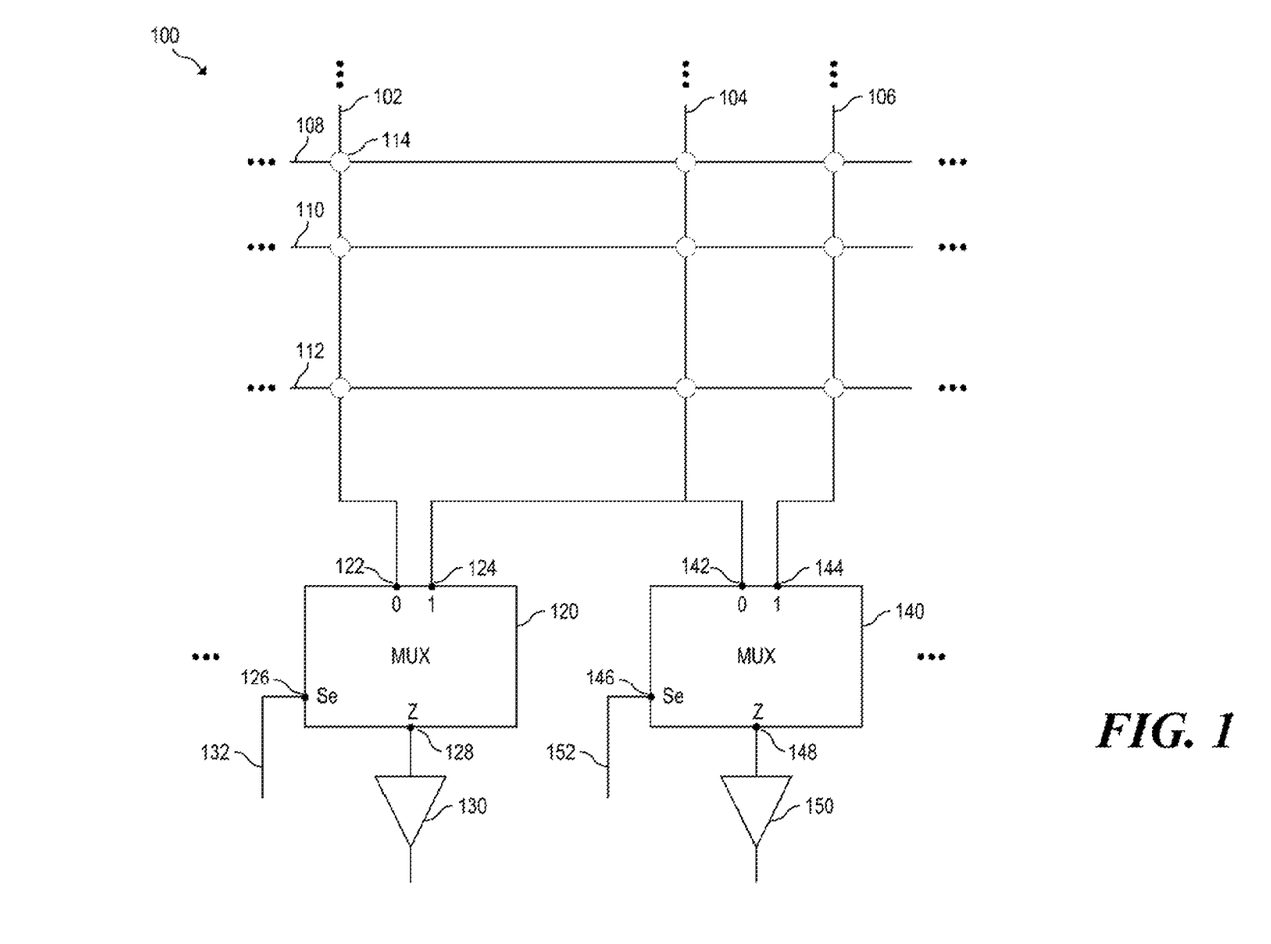
FIG. 1 is a block diagram of an example resistive random access memory (RRAM) array that supports a redundant column in which the columns are selected by a plurality of current-steering multiplexers.

Referring now to the drawings, FIG. 1 is a block diagram of an example resistive random access memory (RRAM) array 100 that includes a first current-steering multiplexer 120 and a second current-steering multiplexer 140. As used herein, RRAM may be a non-volatile random access memory in which state is determined by measuring resistance. In some examples, RRAM may involve changing resistance across a dielectric solid state material. For example, any RRAM described herein may be any of memristor, phase change memory, conductive-bridging random access memory (CBRAM), spin-transfer torque random access memory, and the like. An RRAM array, as used herein, may be an arrangement of RRAM memory cells in rows and columns.

As depicted in FIG. 1, RRAM array 100 may comprise a plurality of row lines 108, 110, and 112 and a plurality of column lines 102, 104, and 106. Although three row lines and three column lines are illustrated, RRAM array 100 may comprise any number of suitable row lines and column lines. In some examples, a symmetric array may have "n" row lines and "n" column lines, wherein "n" represents any suitable number of row lines and column lines. In other examples, an asymmetric array may have "n" and "n+x" number of row lines or column lines, wherein "x" represents any suitable number of lines.

In the example of FIG. 1, row lines 108, 110, and 112 are perpendicular to column lines 102, 104, and 106 such that each row line intersects each column line at a cross point. At each cross point is an RRAM cell 114. As used herein, an RRAM cell may refer to a cell within an RRAM array that stores and maintains one bit of information until it is changed by a set or reset signal. In some examples, an RRAM cell may comprise a switching medium with differing resistance characteristics placed between two metallic filaments or electrodes having different polarities. In some such examples, application of a voltage at a terminal of the RRAM cell may change the resistive state of the RRAM cell. For instance, applying a voltage at one terminal may force the RRAM cell from a high resistive state to a low resistive state (i.e., may "set" the cell) and applying a voltage at another terminal may force the RRAM cell from a low resistive state to a high resistive state (i.e., may "reset" the cell).

A first column line 102 of RRAM array 100 may be coupled to a first current-steering multiplexer 120. As used herein, a current-steering multiplexer (MUX) may refer to a device that selects one of several current signals. As shown in FIG. 1, first current-steering MUX 120 may comprise a 2:1 MUX, meaning a multiplexer that selects "1" of "2" signals. In other examples, first current-steering MUX 120 may also receive a signal that it routes to one of two outputs. First current-steering MUX 120 may be coupled to first column line 102 at first input 122. In some examples, first input 122 of first current-steering MUX 120 may receive current signals from first column line 102. Although first input 122 may act as an input when a current signal is being received from first column line 102, in some examples, first input 122 may also act as an output to output a signal onto first column line 102. In some such examples, first input 122 may act as a bidirectional node. In such examples, first current-steering MUX 120 may act as a MUX or a demultiplexer (deMUX). A deMUX, as used herein, may refer to a device that routes a single input line to one of several output lines.

First current-steering MUX 120 may also be coupled to second column line 104 at second input 124. In some examples, second input 124 of first current-steering MUX 120 may receive current signals from second column line 104. Although second input 124 may act as an input when a current signal is being received from second column line 104, in some examples, second input 124 may also act as an output to output a signal onto second column line 104. In some such examples, second input 124 may act as a bidirectional node.

First current-steering MUX 120 may further include a select input 126 coupled to a first column select signal 132. The first column select signal 132 may select one the first column line 102 and the second column line 104, depending on its status. For instance, in some examples, a low column select signal 132 at select input 126 of first current-steering MUX 120 may select the first column line 102. A high column select signal 132 may conversely select the second column line 104.

As shown in FIG. 1, first current-steering MUX 120 may also include an output 128 coupled to a first current sense amplifier 130. As used herein, a current-sense amplifier may refer to a device that may sense and amplify a current signal. First current-sense amplifier 130 may also enforce a virtual ground at output 128. First current-steering MUX 120 may enforce this voltage for a selected column line. In some examples, output 128 of first current-steering MUX 120 may output a current signal from one of first column line 102 and second column line 104 to first current-sense amplifier 130, based on first column select signal 132 at select input 126. Output 128 may act as an output when first input 122 and second input 124 of first current-steering MUX 120 act as inputs. In some examples, however, output 128 may be additionally coupled to a driver (not shown) and may act as an input to receive a signal from the driver. In some such examples, the input signal at output 128 may be output onto one of first column line 102 and second column line 104 based on the first column select signal 132. In some such examples, output 128 may act as a bidirectional node.

Second column line 104, in addition to being coupled to second input 124 of first current-steering MUX 120, may also be coupled to first input 142 of second current-steering MUX 140. In some examples, first input 142 of second current-steering multiplexer 140 may receive current signals from second column line 104. First input 142 may act as an input when a current signal is being received from second column line 104. However, like first input 122 of first current-steering multiplexer 120, in some examples, first input 142 may also act as an output to output a signal onto second column line 104. In some such examples, first input 142 may act as a bidirectional node. In such examples, second current-steering MUX 140 may act as a MUX or a deMUX.

Second current-steering MUX 140 may also be coupled to third column line 106 at second input 144. In some examples, second input 144 of second current-steering MUX 140 may receive current signals from third column line 106. Although second input 144 may act as an input when a current signal is being received from third column line 106, in some examples, second input 144 may also act as an output to output a signal onto third column line 106. In some such examples, second input 144 may act as a bidirectional node.

Second current-steering MUX 140 may further include a select input 146 coupled to a second column select signal 152. The second column select signal 152 may select one the second column line 104 and the third column line 106, depending on its status. For instance, in some examples, a low column select signal 152 at select input 146 of first current-steering MUX 140 may select the second column line 104. A high column select signal 152 may conversely select the second column line 106.

Second current-steering MUX 140 may also include an output 148 coupled to a second current sense amplifier 150. Second current-sense amplifier 150 may enforce a virtual ground at output 148. Second current-steering MUX 140 may enforce this voltage for a selected column line. In some examples, output 148 of second current-steering MUX 140 may output a current signal from one of second column line 104 and third column line 106 to second current-sense amplifier 150, based on second column select signal 152 at select input 146. Output 148 may act as an output when first input 142 and second input 144 of second current-steering MUX 140 act as inputs. In some examples, however, output 148 may be additionally coupled to a driver (not shown) and may act as an input to receive a signal from the driver. In some such examples, the input signal at output 148 may be output onto one of second column line 104 and third column line 106 based on second column select signal 152. In some such examples, output 148 may act as a bidirectional node.

Although two current-steering multiplexers are illustrated, RRAM array 100 may comprise any number of suitable current-steering multiplexers based (at least in part) on the number of column lines. For example, an RRAM array having "n" current-steering multiplexers may have "n+1" column lines, wherein one of the column lines is redundant and may be discarded. Based on a high and low status of the column select signals, i.e., first column select signal 132 and second column select signal 152, a column line of the plurality of column lines 102, 104, and 106 may be unselected and thus effectively discarded.

In some examples, column lines 102, 104, and 106 may support a single-ended analog current signal. In some such examples, when a known single-ended analog voltage is placed across a row line of the plurality of row lines 109, 110, and 112, a single-ended analog current signal may be generated on a corresponding column line. A current-sense amplifier may enforce a virtual ground at a current-steering MUX and the current-steering MUX may enforce the virtual ground for a selected column line such that the voltage across a memory cell is known (i.e., voltage differential between the voltage applied at the row line and the virtual ground). Based (at least in part) on the applied voltage and the generated current signal, an RRAM cell may be sensed (i.e., read) or written. In other examples, column lines 102, 104, and 106 may also support a single-ended analog voltage signal. In some such examples, when a known single-ended analog voltage is placed across a column line of the plurality of column lines 102, 104, and 106, a single-ended analog current signal may be generated on a corresponding row line. Based (at least in part) on the applied voltage and the generated current signal, an RRAM cell may be sensed (i.e., read) or written. In some examples, the implementation of RRAM array 100 described herein in relation to FIG. 1 may be employed in relation to any of FIGS. 2-5.

Figure 2:
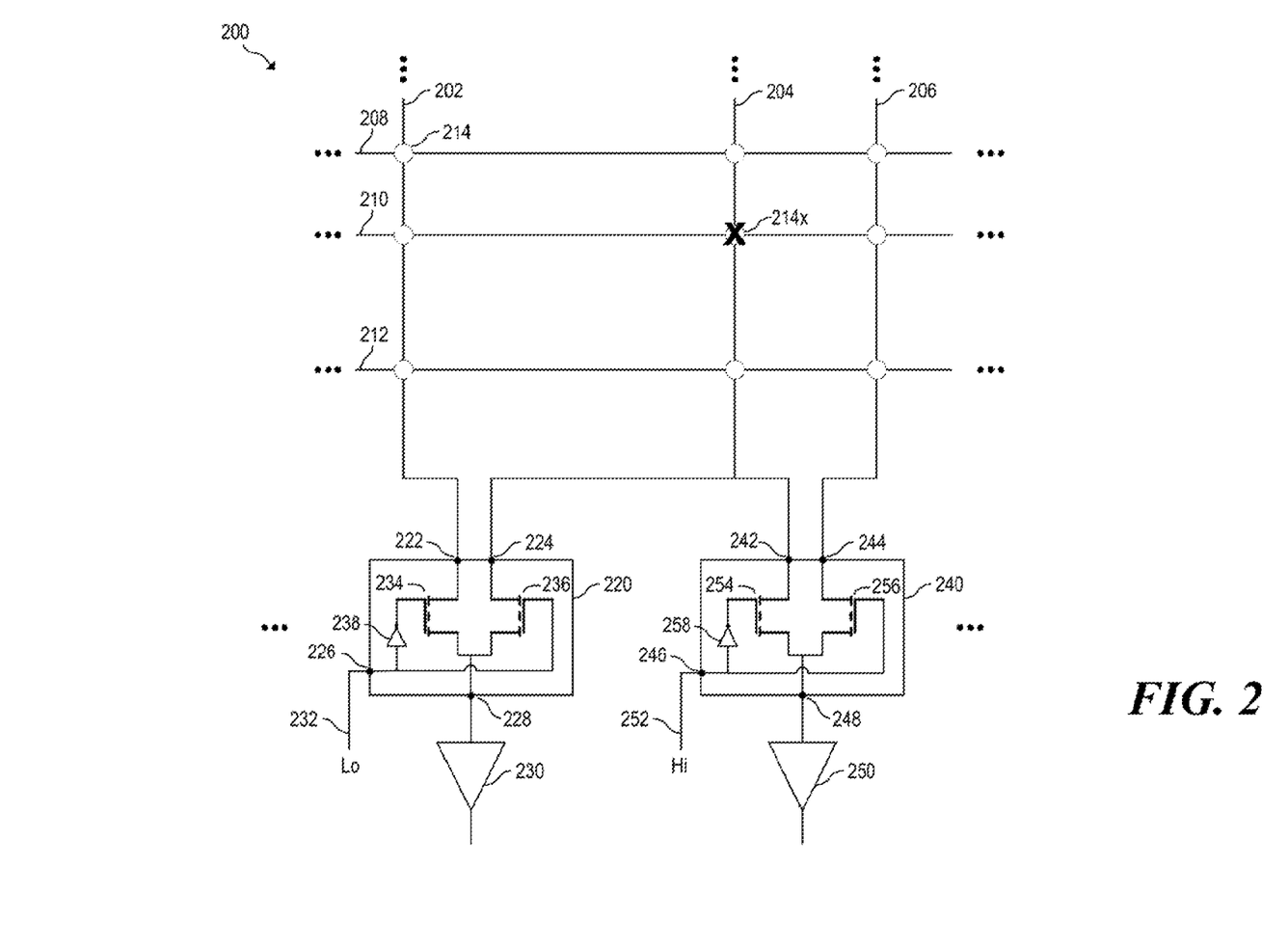
FIG. 2 is a block diagram of an example RRAM array that supports a redundant column in which the columns are selected by first and second field-effect transistors (FETs) of current-steering multiplexers.

FIG. 2 is a block diagram of an RRAM array 200 that includes a first current-steering multiplexer 220 and a second current-steering multiplexer 240 comprising first and second n-channel field-effect transistors. As described above in relation to FIG. 1, RRAM array 200 may comprise a plurality of row lines 208, 210, and 212 and a plurality of column lines 202, 204, and 206. Although three row lines and three column lines are illustrated, RRAM array 200 may comprise any number of suitable row lines and column lines.

In the example of FIG. 2, as described above in relation to the row lines and column lines of FIG. 1, row lines 208, 210, and 212 are perpendicular to column lines 202, 204, and 206 such that each row line intersects each column line at a cross point. At each cross point is an RRAM cell 214. A first column line 202 of RRAM array 200 may be coupled to a first current-steering multiplexer 220. As shown in FIG. 2, first current-steering MUX 220 may comprise a 2:1 MUX, meaning a multiplexer that selects "1" of "2" signals. In other examples, first current-steering MUX 220 may also receive a signal that it routes to one of two outputs.

First current-steering MUX 220 may be coupled to first column line 202 at first input 222, as described above in relation to FIG. 1. In some examples, first input 222 of first current-steering MUX 220 may receive current signals from first column line 202. In other examples, first input 222 may act as an output. In such examples, first current-steering MUX 220 may act as a MUX or a deMUX. First current-steering MUX 220 may also be coupled to second column line 204 at second input 224, as described above in relation to FIG. 1. In some examples, second input 224 of first current-steering MUX 220 may receive current signals from second column line 204. In other examples, second input 224 may act as an output.

As shown, first current-steering MUX 220 may comprise a first field-effect transistor (FET) 234 and a second FET 236. In some examples, first FET 234 and second FET 236 may comprise n-channel field-effect transistors (nFETs). For instance, nFETs may be used in a bipolar RRAM array in which polarity of the RRAM cell reverses during a reset operation compared to a set operation. In other examples, first FET 234 and second FET 236 may comprise p-channel field-effect transistors (pFETs). A unipolar RRAM array, in which a reset operation and a set operation leave polarity unaffected, but use different voltages, may use pFETs in first current-steering MUX 220. In yet other examples, first FET 234 and second FET 236 may comprise full pass gates. In such examples, first FET 234 and second FET 236 may each comprise an nFET in parallel with a pFET.

First current-steering MUX 220 may further include a select input 226 coupled to a first column select signal 232. The first column select signal 232 may select one the first column line 202 and the second column line 204, depending on its status. Select input 226 of first current-steering MUX 220 may couple to the gate of second FET 236 and may couple to the gate of first FET 234 via an inverter 238. Accordingly, in such examples, a low column select signal 232 at select input 226 of first current-steering MUX 220 may select the first column line 202. A high column select signal 232 may conversely select the second column line 204.

As shown in FIG. 2, first current-steering MUX 220 may also include an output 228 coupled to a first current sense amplifier 230. First current-sense amplifier 230 may also enforce a virtual ground at output 228. First current-steering MUX 220 may enforce this voltage for a selected column line. In some examples, output 228 of first current-steering MUX 220 may output a current signal from one of first column line 202 and second column line 204 to a first current-sense amplifier 230, based on first column select signal 232 at select input 226. Output 228 may act as an output when first input 222 and second input 224 of first current-steering MUX 220 act as inputs. In some examples, however, output 228 may be additionally coupled to a driver (not shown) and may act as an input to receive a signal from the driver. In some such examples, the input signal at output 228 may be output onto one of first column line 202 and second column line 204 based on the first column select signal 232. In some such examples, output 228 may act as a bidirectional node.

Second column line 204, in addition to being coupled to second input 224 of first current-steering MUX 220, may also be coupled to first input 242 of second current-steering MUX 240, as described above in relation to second column line 104 of FIG. 1. In some examples, first input 242 of second current-steering multiplexer 240 may receive current signals from second column line 204. First input 242 may act as an input when a current signal is being received from second column line 204. However, like first input 222 of first current-steering multiplexer 220, in some examples, first input 242 may also act as an output to output a signal onto second column line 204. In some such examples, first input 242 may act as a bidirectional node. In such examples, second current-steering MUX 240 may act as a MUX or a deMUX.

Second current-steering MUX 240 may also be coupled to third column line 206 at second input 244, as described above in relation to third column line 106 of FIG. 1. In some examples, second input 144 of second current-steering MUX 140 may receive current signals from third column line 206. Although second input 244 may act as an input when a current signal is being received from third column line 206, in some examples, second input 244 may also act as an output to output a signal onto third column line 206. In some such examples, second input 244 may act as a bidirectional node.

Like first current-steering MUX 220, second current-steering MUX 240 may comprise a first field-effect transistor (FET) 254 and a second FET 256. In some examples, first FET 254 and second FET 256 may comprise nFETs. For instance, nFETs may be used in a bipolar RRAM array. In other examples, first FET 254 and second FET 256 may comprise pFETs. A unipolar RRAM array may use pFETs in second current-steering MUX 240. In yet other examples, first FET 254 and second FET 256 may comprise full pass gates.

Second current-steering MUX 240 may further include a select input 246 coupled to a second column select signal 252. The second column select signal 252 may select one the second column line 204 and the third column line 206, depending on its status. Select input 246 of second current-steering MUX 240 may couple to the gate of second FET 256 and may couple to the gate of first FET 254 via an inverter 258. Accordingly, in such examples, a low column select signal 252 at select input 246 of first current-steering MUX 240 may select the second column line 204. A high column select signal 252 may conversely select the third column line 206.

Second current-steering MUX 240 may also include an output 248 coupled to a second current sense amplifier 250. Second current-sense amplifier 250 may enforce a virtual ground at output 248. Second current-steering MUX 240 may enforce this voltage for a selected column line. In some examples, output 248 of second current-steering MUX 240 may output a current signal from one of second column line 204 and third column line 206 to second current-sense amplifier 250, based on second column select signal 252 at select input 246. Output 248 may act as an output when first input 242 and second input 244 of second current-steering MUX 240 act as inputs. In some examples, however, output 248 may be additionally coupled to a driver (not shown) and may act as an input to receive a signal from the driver. In some such examples, the input signal at output 248 may be output onto one of second column line 204 and third column line 206 based on second column select signal 252. In some such examples, output 248 may act as a bidirectional node.

Although two current-steering multiplexers are illustrated, RRAM array 200 may comprise any number of suitable current-steering multiplexers based (at least in part) on the number of column lines. For example, an RRAM array having "n" current-steering multiplexers may have "n+1" column lines, wherein one of the column lines is redundant and may be discarded. Based on a high and low status of the column select signals, i.e., first column select signal 232 and second column select signal 252, a column line of the plurality of column lines 202, 204, and 206 may be unselected and thus effectively discarded.

In some examples, column lines 202, 204, and 206 may support a single-ended analog current signal. In some such examples, when a known single-ended analog voltage is placed across a row line of the plurality of row lines 209, 210, and 212, a single-ended analog current signal may be generated on a corresponding column line. A current-sense amplifier may enforce a virtual ground at a current-steering MUX and the current-steering MUX may enforce the virtual ground for a selected column line such that the voltage across a memory cell is known (i.e., voltage differential between the voltage applied at the row line and the virtual ground). Based (at least in part) on the applied voltage and the generated current signal, an RRAM cell may be sensed (i.e., read) or written. In other examples, column lines 202, 204, and 206 may also support a single-ended analog voltage signal. In some such examples, when a known single-ended analog voltage is placed across a column line of the plurality of column lines 202, 204, and 206, a single-ended analog current signal may be generated on a corresponding row line. Based (at least in part) on the applied voltage and the generated current signal, an RRAM cell may be sensed (i.e., read) or written.

It may be determined in some instances that a column line of the plurality of column lines has failed. In some examples, a faulty RRAM cell within the column line may result in the failure of the column line. In other examples, other failures within the column line may result in the failure of the column line. In the example of FIG. 2, it may be determined that RRAM cell 214x of RRAM array 200 is faulty, thus leading to the determination that second column line 204 has failed. In such an example, first column select signal 232 may be set low to always select first column line 202 and thus avoid failed second column line 204. Similarly, second column select signal 252 may be set high to always select third column line 206 and thus avoid failed second column line 204. Though not shown in FIG. 2, any additional current-steering MUXes to the left of failed second column line 204 may have their select inputs set low to avoid failed second column line 204 and any additional current-steering MUXes to the right of failed second column line 204 may have their select inputs set high. In such an example, failed second column line 204 may be effectively discarded.

In other examples, first and second current-steering MUXes 220 and 240 may have different configurations. In one example, inverters 238 and 258 may be coupled to the gates of second FET 236 and second FET 256, respectively, rather than first FET 234 and first FET 254. In such examples, first column select signal 232 may be set such that it selects the column line that has not failed. Likewise, second column select signal 252 may be set such that it too selects the column line that has not failed.

In some examples, column lines and/or RRAM cells may be tested during production. In such examples, a faulty or failed column line may result in the rejection of that line via the permanent application of column select signals to the current-steering MUXes of the RRAM array that avoid selecting the failed column line. In some examples, the implementation of RRAM array 200 described herein in relation to FIG. 2 may be employed in relation to any of FIGS. 1 and 3-5.

Figure 3:
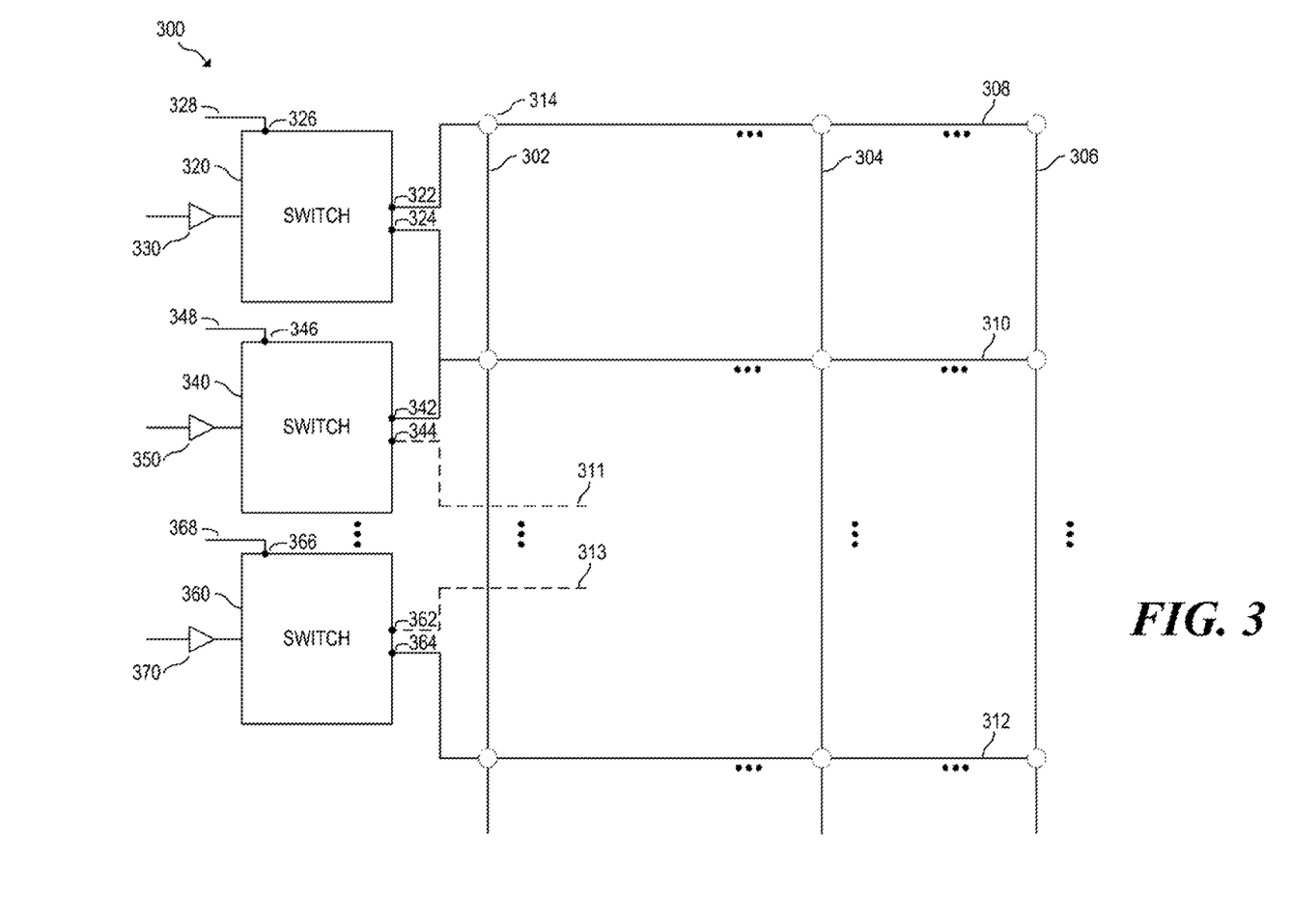
FIG. 3 is a block diagram of an example RRAM array that supports a redundant row in which the rows are selected by a plurality of switches.

Further examples are described in relation to FIG. 3. FIG. 3 is a block diagram of an example RRAM array 300 that supports a redundant row in which the rows are selected by a plurality of switches 326, 346, and 366. As depicted in FIG. 3, RRAM array 300 may comprise a plurality of row lines 308, 310, 311, 312, and 313, and a plurality of column lines 302, 304, and 306. Although five row lines and three column lines are illustrated, RRAM array 300 may comprise any number of suitable row lines and column lines. In some examples, a symmetric array may have "n" row lines and "n" column lines, wherein "n" represents any suitable number of row lines and column lines. In other examples, an asymmetric array may have "n" and "n+x" number of row lines or column lines, wherein "x" represents any suitable number of lines.

In the example of FIG. 3, row lines 308, 310, 311, 312, and 313 are perpendicular to column lines 302, 304, and 306 such that each row line intersects each column line at a cross point. At each cross point is an RRAM cell 314. Row line 308 of RRAM array 300 comprises a first row line 308 of the plurality of row lines. Row line 312 of RRAM array 300 comprises a last row line 312 of the plurality of row lines. Any rows between first row line 308 and last row line 312 comprises a remainder of row lines of the plurality of row lines. For example, row lines 310, 311, and 313 along with any additional row lines between first row line 308 and last row line 312 (as illustrated, in part, by the dashed lines and ellipses in FIG. 3) comprise the remainder of row lines of the plurality of row lines. Similarly, column line 302 of RRAM array 300 comprises a first column line 302 of the plurality of column lines. Column line 306 of RRAM array 300 comprises a last column line 306 of the plurality of column lines. And column line 304 along with any additional column lines between first column line 302 and last column line 306 (as illustrated, in part, by the ellipses in FIG. 3) comprise the remainder of row lines of the plurality of row lines.

As depicted in the example of FIG. 3, a plurality of switches such as switch 320, switch 340, and switch 360 may be coupled to the plurality of row lines. As used herein, a switch may refer to a device that selects one of two signals. In some examples, a switch may be a multiplexer such as a current-steering multiplexer or a voltage multiplexer. First row line 308 of the plurality of row lines may be coupled to first switch 320 of the plurality of switches. In some examples, first row line 308 may be coupled to a first output 322 of first switch 320. First output 322 of first switch 320, in some instances, may output a voltage signal or a current signal onto first row line 308. Last row line 312 of the plurality of row lines may be coupled to last switch 360 of the plurality of switches. In some examples, last row line 312 may be coupled to a second output 364 of last switch 360. Second output 364 of last switch 360, in some instances, may output a voltage signal or a current signal onto last row line 312.

Last switch 360 may also have a first output 362 that may be coupled to one of the remainder of row lines of the plurality of row lines (as shown by the dashed line). In the example of FIG. 3, first output 362 of last switch 360 may output a voltage signal or a current signal onto row line 313. In a simple example involving only three row lines, however, RRAM array 300 may comprise the first switch 320 and last switch 360 such that first output 362 of last switch 360 is coupled to row line 310.

Row line 310, one of the remainder of row lines of the plurality of row lines, may be coupled to two switches of the plurality of switches. In some examples, as depicted, row line 310 may be coupled to first switch 320 via a second output 324. Second output 324 of first switch 320, in some instances, may output a voltage signal or a current signal onto row line 310. Row line 310 may also be coupled to switch 340 of the plurality of switches via a first output 342. First output 342 of switch 340, in some instances, may output a voltage signal or a current signal onto row line 310.

As depicted in FIG. 3, a second output 344 of switch 340 may be coupled to one of the remainder of row lines (shown as a dashed line). Second output 344 of switch 340, in some instances, may output a voltage signal or a current signal onto row line 311. In a simple example involving only three row lines, however, switch 340 may comprise the last switch such that second output 344 of switch 340 is coupled to last row line 312.

Each of the switches of the plurality of switches in RRAM array 300, e.g., first switch 320, switch 340, and last switch 360 may be coupled to one of a plurality of row select signals 328, 348, and 368. For example, first switch 320 may be coupled to row select signal 328 via a select input 326. Row select signal 328 may select one of first row line 308 and row line 310, depending on its status. For instance, in some examples, a low row select signal 328 at select input 326 of first switch 320 may select the first row line 308. A high row select signal 328 may conversely select the row line 310.

In some examples, switch 340 may be coupled to row select signal 348 via a select input 346. Row select signal 348 may select one of row line 310 and row line 311, depending on its status. For instance, in some examples, a low row select signal 348 at select input 346 of switch 340 may select row line 310. A high row select signal 348 may conversely select row line 311.

Last switch 360 may be coupled to row select signal 368 via a select input 366. Row select signal 368 may select one of row line 313 and last row line 312, depending on its status. For instance, in some examples, a low row select signal 368 at select input 366 of last switch 360 may select row line 313. A high row select signal 368 may conversely select last row line 312.

Each of the switches of the plurality of switches in RRAM array 300, e.g., first switch 320, switch 340, and last switch 360 may also be coupled to one of a plurality of drivers 330, 350, and 370. As used herein, a driver may refer to a device that may apply a particular current or a voltage. In some examples, drivers 330, 350, and 370 may drive voltage signals.

In one example, driver 330 may drive a low voltage to first switch 320. Based (at least in part) on row select signal 328, one of first row line 308 and row line 310 may be selected and the low voltage applied to that row. If the low voltage falls within a suitable range, the low voltage may be referred to as a reset voltage and may reset a particular RRAM cell on the selected row or, in some examples, may reset each RRAM cell on the selected row. In other examples, driver 330 may drive a high voltage to first switch 320. Based (at least in part) on row select signal 328, one of first row line 308 and row line 310 may be selected and the high voltage applied to that row. If the high voltage falls within a suitable range, the high voltage may be referred to as a set voltage and may set a particular RRAM cell on the selected row or, in some examples, may set each RRAM cell on the selected row. In yet other examples, driver 330 may drive a read voltage to first switch 320, wherein the read voltage allows for an RRAM cell to be sensed without altering its state. Based (at least in part) on row select signal 328, one of first row line 308 and row line 310 may be selected and the read voltage applied to that row such that a particular RRAM cell on the selected row may be read or, in some examples, each RRAM cell of the selected row may be read.

Likewise, driver 350 may drive a reset voltage, a set voltage, or a read voltage to switch 340 such that based (as least in part) on row select signal 348, one of row line 310 and row line 311 is selected and the reset, set, or read voltage is applied on the selected row. Similar to drivers 330 and 350, driver 370 may also drive a reset voltage, a set voltage, or a read voltage to last switch 360 such that based (as least in part) on row select signal 368, one of row line 313 and last row line 312 is selected and the reset, set, or read voltage is applied on the selected row. In some such examples in which drivers 330, 350, and 370 drive a voltage such as a single-ended analog voltage, switches 320, 340, and 360 may comprise voltage multiplexers capable of handling single-ended analog voltages. In such examples, the plurality of column lines 302, 304, and 306 may support single-ended analog current signals.

In other examples, drivers 330, 350, and 370 may drive current signals. In some such examples, drivers 330, 350, and 370 may drive a reset current, a set current, or a read current. In one example, driver 330 may drive a high current to first switch 320. Based (at least in part) on row select signal 328, one of first row line 308 and row line 310 may be selected and the high current applied to that row. If the high current falls within a suitable range, the high current may be referred to as a set current and may set a particular RRAM cell on the selected row or, in some examples, may set each RRAM cell on the selected row. In other examples, driver 330 may drive a low current to first switch 320. Based (at least in part) on row select signal 328, one of first row line 308 and row line 310 may be selected and the low current applied to that row. If the low current falls within a suitable range, the low current may be referred to as a reset current and may reset a particular RRAM cell on the selected row or, in some examples, may reset each RRAM cell on the selected row. In yet other examples, driver 330 may drive a read current to first switch 320, wherein the read current allows for an RRAM cell to be sensed without altering its state. Based (at least in part) on row select signal 328, one of first row line 308 and row line 310 may be selected and the read current applied to that row such that a particular RRAM cell on the selected row may be read or, in some examples, each RRAM cell of the selected row may be read (e.g., sensing a high voltage from an RRAM cell would mean that the cell is in a high resistive state and vice versa).

Likewise, driver 350 may drive a reset current, a set current, or a read current to switch 340 such that based (as least in part) on row select signal 348, one of row line 310 and row line 311 is selected and the reset, set, or read current is applied on the selected row. Similar to drivers 330 and 350, driver 370 may also drive a reset current, a set current, or a read current to last switch 360 such that based (as least in part) on row select signal 368, one of row line 313 and last row line 312 is selected and the reset, set, or read current is applied on the selected row. In some such examples in which drivers 330, 350, and 370 drive a current such as a single-ended analog current, switches 320, 340, and 360 may comprise current-steering multiplexers capable of handling single-ended analog currents. In such examples, the plurality of column lines 302, 304, and 306 may support single-ended analog voltage signals.

Although three switches are illustrated, RRAM array 300 may comprise any number of suitable switches based (at least in part) on the number of row lines. For example, an RRAM array having "n" switches may have "n+1" row lines, wherein one of the row lines is redundant and may be discarded. Based on a high and low status of the row select signals, i.e., first row select signal 328, second row select signal 348, and third row select signal 368, a row line of the plurality of row lines 308, 310, and 312 may be unselected and thus effectively discarded. In some examples, the implementation of RRAM array 300 described herein in relation to FIG. 3 may be employed in relation to any of FIGS. 1-2 and 4-5.

Figure 4:
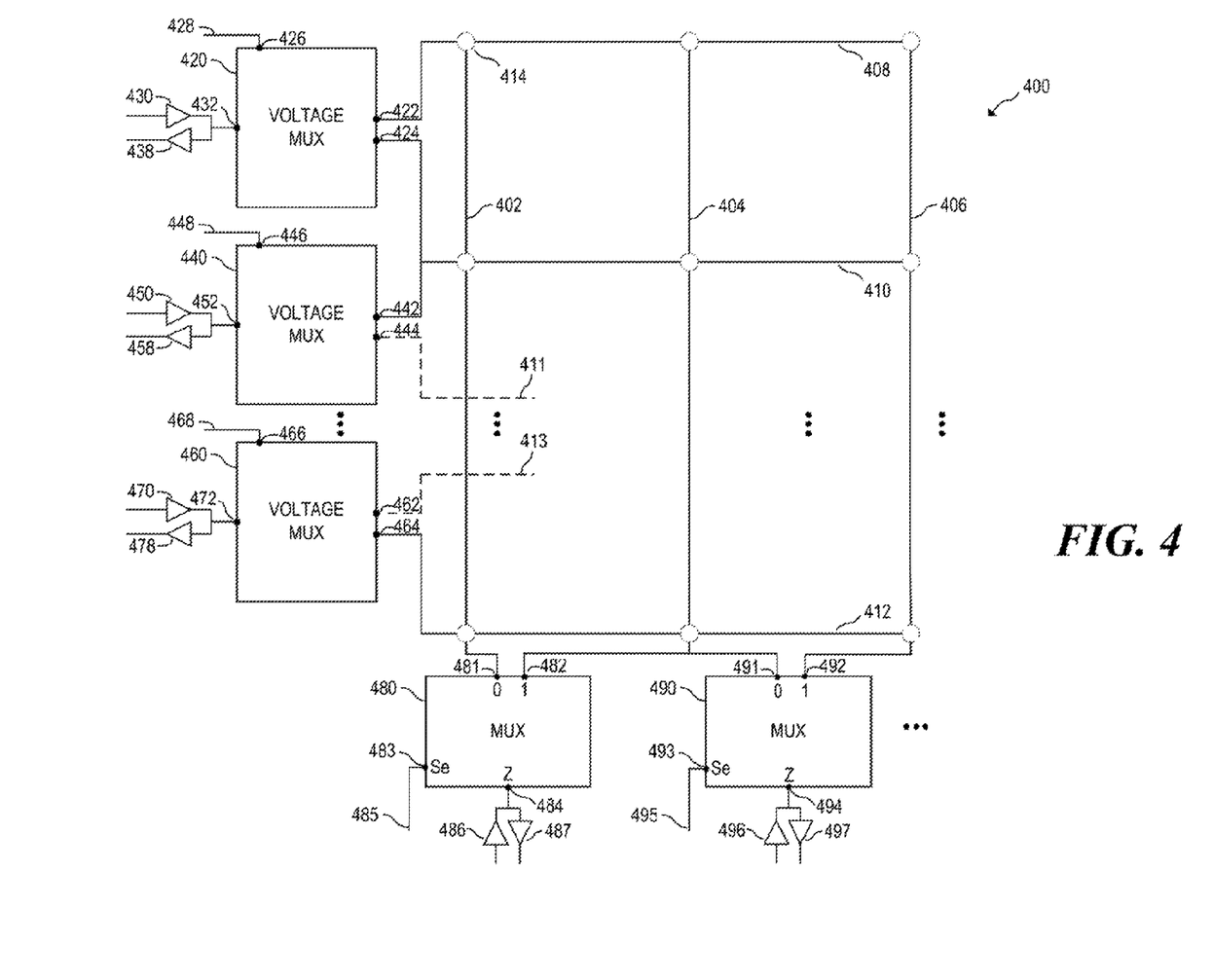
FIG. 4 is a block diagram of an example RRAM array that supports a redundant row in which the rows are selected by a plurality of voltage multiplexers and that also supports a redundant column in which the columns are selected by a plurality of current-steering multiplexers.

FIG. 4 is a block diagram of an example RRAM array 400 that supports a redundant row in which the rows are selected by a plurality of voltage multiplexers 326, 346, and 366 and that also supports a redundant column in which the columns are selected by a plurality of current-steering multiplexers. As depicted in FIG. 4, RRAM array 400 may comprise a plurality of row lines 408, 410, 411, 412, and 413, and a plurality of column lines 402, 404, and 406. Although five row lines and three column lines are illustrated, RRAM array 400 may comprise any number of suitable row lines and column lines. In some examples, a symmetric array may have "n" row lines and "n" column lines, wherein "n" represents any suitable number of row lines and column lines. In other examples, an asymmetric array may have "n" and "n+x" number of row lines or column lines, wherein "x" represents any suitable number of lines.

As described above in relation to FIG. 3, row lines 408, 410, 411, 412, and 413 are perpendicular to column lines 402, 404, and 406 such that each row line intersects each column line at a cross point. At each cross point is an RRAM cell 414. Row line 408 and row line 412 of RRAM array 400 comprise first and last row lines of the plurality of row lines. Row lines 410, 411, and 413 along with any additional row lines between first row line 408 and last row line 412 (as illustrated, in part, by the dashed lines and ellipses in FIG. 4) comprise the remainder of row lines of the plurality of row lines. Similarly, column line 402 and column line 406 comprise first and last row lines of the plurality of row lines. Column line 404 comprises the remainder of row lines of the plurality of row lines. Though three column lines are shown here for illustrative purposes, any suitable number of column lines may be used.

Voltage MUXes 420, 440, and 460 may be coupled to the plurality of row lines. A voltage MUX, as used herein, may refer to a multiplexer that is capable of handling single-ended analog voltages. As described above in relation to FIG. 3, first row line 408 of the plurality of row lines may be coupled to first voltage MUX 420 via a first output 422. In some examples, first output 422 may output a voltage signal onto first row line 408. In other examples, first output 422 may act as an input and receive a voltage signal from first row 408. First output 422 may act as a bidirectional node. In such examples, first voltage MUX 420 may act as a MUX or a deMUX. Last row line 412 of the plurality of row lines may be coupled to last voltage MUX 460. In some examples, last row line 412 may be coupled to a second output 464 of last voltage MUX 460. In some examples, second output 464 may output a voltage signal onto last row line 412. In other examples, second output 464 may act as an input and receive a voltage signal from last row line 412. Second output 464 may act as a bidirectional node. In such examples, last voltage MUX 460 may act as a MUX or a deMUX.

Last voltage MUX 460, as described above in relation to FIG. 3, may also have a first output 462 coupled to row line 413. In some examples, first output 462 may output a voltage signal onto row line 413. In other examples, first output 462 may act as an input and receive a voltage signal from row line 413. First output 462 may act as a bidirectional node. In a simple example involving only three row lines, however, RRAM array 400 may comprise first voltage MUX 420 and last voltage MUX 460 such that first output 462 of last voltage MUX 460 is coupled to row line 410.

Row line 410, as described above in relation to FIG. 3, one of the remainder of row lines of the plurality of row lines, may be coupled to two voltage MUXes. In some examples, as depicted, row line 410 may be coupled to first voltage MUX 420 via a second output 424. In some examples, second output 424 may output a voltage signal onto row line 410. In other examples, second output 424 may act as an input and receive a voltage signal from row line 410. Second output 424 may act as a bidirectional node. Row line 410 may also be coupled to voltage MUX 440 via a first output 442. In some examples, first output 442 of voltage MUX 440 may output a voltage signal to row line 410. In other examples, first output 442 may act as an input and receive a voltage signal from row line 410. First output 442 may act as a bidirectional node.

As depicted in FIG. 4, a second output 444 of voltage MUX 440 may be coupled to one of the remainder of row lines, row line 411 (shown as a dashed line). In some examples, second output 444 may output a voltage signal onto row line 411. In other examples, second output 444 may act as an input and receive a voltage signal from row line 411. Second output 444 may act as a bidirectional node. In such examples, voltage MUX 440 may act as a MUX or a deMUX. In a simple example involving only three row lines, however, voltage MUX 440 may comprise the last voltage MUX such that second output 444 is coupled to last row line 412.

Each of the voltage MUXes in RRAM array 400, e.g., first voltage MUX 420, voltage MUX 440, and last voltage MUX 460 may be coupled to one of a plurality of row select signals 428, 448, and 468. As described above in relation to FIG. 3, first voltage MUX 420 may be coupled to row select signal 428 via a select input 426. Row select signal 428 may select one of first row line 408 and row line 410, depending on its status. In some examples, voltage MUX 440 may be coupled to row select signal 448 via a select input 446. Row select signal 448 may select one of row line 410 and row line 411, depending on its status. Last voltage MUX 460 may be coupled to row select signal 468 via a select input 466. Row select signal 468 may select one of row line 413 and last row line 412, depending on its status.

Each of the voltage MUXes in RRAM array 400 may also have a bidirectional node coupled to a driver and a sense amplifier. As depicted in FIG. 4, first voltage MUX 420 may have a bidirectional node 432 coupled to a voltage driver 430 and a voltage sense amplifier 438. In some examples, voltage driver 430 may drive a voltage to first voltage MUX 420 that is applied to one of first row line 408 and row line 410. In other examples, voltage sense amplifier 438 may sense and amplify a voltage received from one of first row line 408 and row line 410 via first voltage MUX 420. In such examples, the voltage sense amplifier may enforce a known current on the row line. Voltage driver 430 and voltage sense amplifier 438 may support single-ended analog voltage signals.

Similar to first voltage MUX 420, voltage MUX 440 may have a bidirectional node 452 coupled to a voltage driver 450 and a voltage sense amplifier 458. In some examples, voltage driver 450 may drive a voltage to voltage MUX 440 that is applied to one of row line 410 and row line 411. In other examples, voltage sense amplifier 458 may sense and amplify a voltage received from one of row line 410 and row line 411 via voltage MUX 440. Voltage driver 450 and voltage sense amplifier 458 may support single-ended analog voltage signals.

Similar to first voltage MUX 420 and voltage MUX 440, last voltage MUX 460 may have a bidirectional node 472 coupled to a voltage driver 470 and a voltage sense amplifier 478. In some examples, voltage driver 470 may drive a voltage to voltage MUX 460 that is applied to one of row line 413 and last row line 412. In other examples, voltage sense amplifier 478 may sense and amplify a voltage received from one of row line 413 and last row line 412 via voltage MUX 460. Voltage driver 470 and voltage sense amplifier 478 may support single-ended analog voltage signals.

A plurality of current-steering MUXes 480 and 490 may be coupled to the plurality of column lines 402 404, and 406. First column line 402 of the plurality of column lines may be coupled to first current-steering MUX 480. In some examples, first column line 402 may be coupled to first current-steering MUX 480 via a first input 481. In some examples, first input 481 may receive a current signal from first column line 402. In other examples, first input 481 may act as an output and output a current signal onto first column line 402. First input 481 may act as a bidirectional node. In such examples, first current-steering MUX 4800 may act as a MUX or a deMUX.

First current-steering MUX 480 may also be coupled to column line 404. As depicted in FIG. 4, column line 404 is one of a remainder of column lines of the plurality of column lines and is coupled to two current-steering MUXes of the plurality of current-steering MUXes. In some examples, column line 404 may be coupled to first current-steering MUX 480 at second input 482. Second input 482 may receive a voltage signal from column line 404. In other examples, second input 482 may act as an output and output a voltage signal onto column line 404. Second input 482 may act as a bidirectional node. Column line 404 may also be coupled to a first input 491 of last current-steering MUX 490. In some examples, column line 404 may be coupled to last current-steering MUX 490 at first input 491. First input 491 may receive a voltage signal from column line 404. In other examples, first input 491 may act as an output and output a voltage signal onto column line 404. First input 491 of last current-steering MUX may act as a bidirectional node.

Last column line 406 of the plurality of column lines may be coupled to last current-steering MUX 490. In some examples, last column line 406 may be coupled to a second input 492 of last current-steering MUX 490. In some examples, second input 492 may receive a voltage signal from last column line 406. In other examples, second input 492 may act as an output and output a voltage signal onto last column line 406. Second input 492 may act as a bidirectional node. In such examples, last current-steering MUX 490 may act as a MUX or a deMUX.

Each of the current-steering MUXes in RRAM array 400, e.g., first current-steering MUX 480 and last current-steering MUX 490 may be coupled to one of a plurality of column select signals 485 and 495. First current-steering MUX 480 may be coupled to column select signal 485 via a select input 483. Column select signal 485 may select one of first column line 402 and column line 404, depending on its status. Last current-steering MUX 490 may be coupled to column select signal 495 via a select input 493. Column select signal 495 may select one of column line 404 and last column line 406, depending on its status.

Each of the current-steering MUXes in RRAM array 400 may also have a bidirectional node coupled to a driver and a sense amplifier. As depicted in FIG. 4, first current-steering MUX 480 may have a bidirectional node 484 coupled to a current driver 486 and a current sense amplifier 487. In some examples, current driver 486 may drive a current to first current-steering MUX 480 that is applied to one of first column line 402 and column line 404. In other examples, current sense amplifier 487 may sense and amplify a current received from one of first column line 402 and column line 404 via first current-steering MUX 480. First current-sense amplifier 487 may also enforce a virtual ground at bidirectional node. First current-steering MUX 480 may enforce this voltage for a selected column line. Current driver 486 and current sense amplifier 487 may support single-ended analog current signals.

Similar to first current-steering MUX 480, last current-steering MUX 490 may have a bidirectional node 494 coupled to a current driver 496 and a current sense amplifier 497. In some examples, current driver 496 may drive a current to last current-steering MUX 490 that is applied to one of column line 404 and last column line 406. In other examples, current sense amplifier 497 may sense and amplify a current received from one of column line 404 and last column line 406 via last current-steering MUX 490. Second current-sense amplifier 497 may also enforce a virtual ground at bidirectional node 494. Second current-steering MUX 490 may enforce this voltage for a selected column line. Current driver 496 and current sense amplifier 497 may support single-ended analog current signals.

Although three voltage MUXes and two current-steering MUXes are illustrated, RRAM array 400 may comprise any number of suitable voltage MUXes based (at least in part) on the number of row lines and any number of suitable current-steering multiplexers based (at least in part) on the number of column lines. For example, an RRAM array having "n" voltage multiplexers may have "n+1" row lines, wherein one of the row lines is redundant and may be discarded. Likewise, an RRAM array having "n" current-steering multiplexers may have "n+1" column lines, wherein one of the column lines is redundant and may be discarded. Based on a high and low status of the row select signals and column select signals, a row line and a column line of the plurality of row and column lines may be unselected and thus effectively discarded.

In some examples, a known single-ended analog voltage may be applied to a row line of the plurality of row lines. For example, voltage driver 430 may drive a set voltage that is applied to one of first row line 408 and row line 410 based (at least in part) on a row select signal 428 of first voltage MUX 420. The known set voltage applied by driver 430 may set an RRAM cell and generate a corresponding current signal along a column line of the plurality of common lines. The current signal may ultimately be received at an input of one of first current-steering MUX 480 and last current-steering MUX 490 and be output via bidirectional node 484 or 494 to be sensed and amplified by one of current sense amplifier 487 or 497. The current-sense amplifiers may enforce a virtual ground at the current-steering MUXes and the current-steering MUXes may enforce the virtual ground for the selected column line such that the voltage across a memory cell is known (i.e., voltage differential between the voltage applied at the row line and the virtual ground).

In other examples, a known single-ended analog current may be applied to a column line of the plurality of column lines. For example, current driver 486 may drive a reset current that is applied to one of first column line 402 and column line 404 based (at least in part) on a column select signal 485 of first current-steering MUX 480. The known reset current applied by driver 486 may reset an RRAM cell and may generate a corresponding voltage signal along a row line of the plurality of common lines. The voltage signal may ultimately be received at an input of one of first voltage MUX 420, voltage MUX 440, and last voltage MUX 460 and be output via bidirectional node 432, 452, or 472 to be sensed and amplified by one of voltage sense amplifier 438, 458, or 478. In some examples, the implementation of RRAM array 400 described herein in relation to FIG. 4 may be employed in relation to any of FIGS. 1-3 and 5.

Figure 5:
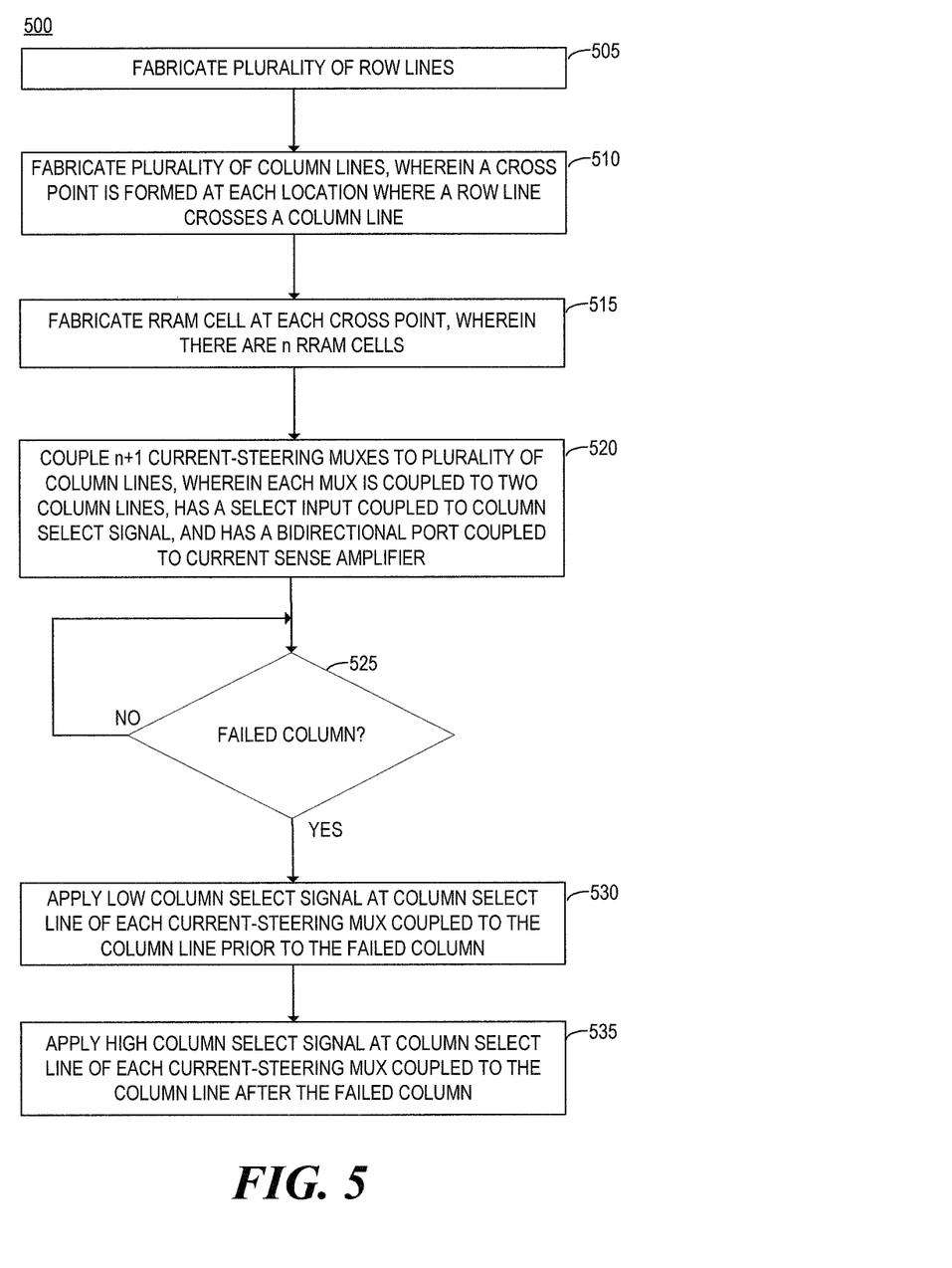
FIG. 5 is a flowchart of an example method of supporting a redundant column in an RRAM array including identifying a failed column line and based on the identification, applying a low column select signal to each current-steering multiplexer.

FIG. 5 is an example method 500 for manufacturing an RRAM array that supports a redundant column. Although method 500 is described below with reference to RRAM array 200 of FIG. 2, method 500 can also be a method of manufacturing other example RRAM arrays (e.g., RRAM array 400 of FIG. 4). Additionally, implementation of method 500 is not limited to such examples.

In the example of FIG. 5, method 500 may be a method of manufacturing RRAM array 200 of FIG. 2. At 505, a plurality of row lines 208, 210, and 212 may be fabricated. As used herein, fabricating may refer to any process used in semiconductor manufacturing. In some examples, fabrication may involve any of modification of electrical properties, deposition, removal, patterning, and the like. At 510, a plurality of column lines 202, 204, and 206 may be fabricated. The plurality of column lines 202, 204, and 206 may be perpendicular to the plurality of row lines 208, 210, and 212. A cross point may be formed at each location where a row line of the plurality of row lines crosses a column line of the plurality of column lines. The plurality of column lines may include n+1 column lines.

At 515, an RRAM cell 214, as depicted in FIG. 2, may be fabricated at each cross point. At 520, first current-steering MUX 220 and second current-steering MUX 240 may be coupled to the plurality of column lines 202, 204, and 206. In some examples, an RRAM array comprising n+1 column lines may also comprise n current-steering MUXes. As depicted in FIG. 2, each current-steering MUX 220 and 240 is coupled to two column lines of the plurality of column lines. For instance, first current-steering MUX 220 is coupled to first column line 202 and second column line 204. Second current-steering MUX 240 is coupled to second column line 204 and third column line 206.

Each current-steering MUX also has a select input coupled to a column select signal and a bidirectional node coupled to a current sense amplifier. As described above in relation to FIG. 2, first current-steering MUX 220 has a select input 226 coupled to a first column select signal 232 to select one of first column 202 and second column 204. First current-steering MUX 220 also has a bidirectional node 228 coupled to a first current sense amplifier 230. Similarly, second current-steering MUX 240 has a select input 246 coupled to a second column select signal 252 to select one of second column 204 and third column 206. Second current-steering MUX 240 also has a bidirectional node 248 coupled to a second current sense amplifier 250.

At 525, it may be determined whether a failed column line has been identified during manufacture and prior to packaging. A column line may fail for a number of reasons, including a faulty RRAM cell or other faults within the column line. In some examples, device testing may identify a failed column line. Device testing may involve electrical testing of each column line, row line, and/or RRAM cell. A determination that there are no failed column lines within the RRAM array may return the method to 525. If a failed column line is identified, the method may proceed to 530. For instance, in the example of FIG. 2, RRAM cell 214x may be identified as a faulty RRAM cell and second column line 204 may be identified as a failed column line.

Based (at least in part) on the identification of the failed column line, at 530, a low column select signal may be applied at the select input of each current-steering MUX coupled to the column of the plurality of column lines prior to the failed column line. As depicted in FIG. 2, first column select signal 232 may be "Lo" and may be applied to select input 226 of first current-steering MUX 220 to select first column line 202 and avoid failed column line 204. Although further current-steering MUXes are not shown to the left of first current-steering MUX 220, any current-steering MUXes to the left would also receive a low column select signal. In some examples, the column select signals may be permanently tied low.

Based (at least in part) on the identification of the failed column line, at 540, a high column select signal may be applied at the select input of each current-steering MUX coupled to the column of the plurality of column lines after to the failed column line. As depicted in FIG. 2, second column select signal 252 may be "Hi" and may be applied to select input 246 of second current-steering MUX 240 to select third column line 206 and avoid failed column line 204. Although further current-steering MUXes are not shown to the right of second current-steering MUX 240, any current-steering MUXes to the right would also receive a high column select signal. In some examples, the column select signals may be permanently tied high.

Although the flowchart of FIG. 5 shows a specific order of performance of certain functionalities, method 500 is not limited to that order. For example, the functionalities shown in succession in the flowchart may be performed in a different order, may be executed concurrently or with partial concurrence, or a combination thereof. In some examples, functionalities described herein in relation to FIG. 5 may be provided in combination with functionalities described herein in relation to any of FIGS. 1-4.

What is claimed is:

1. A resistive random access memory (RRAM) array to support a redundant column comprising:
    an RRAM cell at a cross point of a column line and a row line;
    a first column line coupled to a first input of a first current-steering multiplexer, wherein the first current-steering multiplexer has an output coupled to a first current sense amplifier and a select input coupled to a first column select signal;
    a second column line coupled to a second input of the first current-steering multiplexer and coupled to a first input of a second current-steering multiplexer, wherein the second current-steering multiplexer has an output coupled to a second current sense amplifier and a select input coupled to a second column select signal; and
    a third column line coupled to a second input of the second current-steering multiplexer;
    wherein when one of the column lines has failed, the RRAM array to apply a low column select signal to one of the current-steering multiplexers and a high column select signal to another of the current-steering multiplexers to avoid the failed column line.

2. The RRAM array of claim 1, wherein the RRAM cell is bipolar.

3. The RRAM array of claim 2, wherein the first and second current-steering multiplexers each further comprises a first n-channel field-effect transistor (nFET) and a second nFET.

4. The RRAM array of claim 2, wherein the first and second current-steering multiplexers each further comprises a first full pass gate and a second full pass gate.

5. The RRAM array of claim 3, wherein the second column line has failed and wherein the first column select signal is set low and the second column select signal is set high to avoid the failed second column line.

6. The RRAM array of claim 1, wherein the RRAM cell is unipolar.

7. The RRAM array of claim 6, wherein the first and second current-steering multiplexers each further comprises a first p-channel field-effect transistor (pFET) and a second pFET.

8. The RRAM array of claim 1, wherein the first, second, and third column lines support a single-ended analog current signal.

9. The RRAM array of claim 1, wherein the RRAM array is a symmetric array.

10. The RRAM array of claim 1, wherein the RRAM array is an asymmetric array.

11. A resistive random access memory (RRAM) array to support a redundant column comprising:
    a plurality of row lines;

a plurality of column lines perpendicular to the plurality of row lines, wherein a cross point is formed at each location where a row line of the plurality of row lines crosses a column line of the plurality of column lines;

an RRAM cell at each cross point;

a plurality of current-steering multiplexers coupled to the plurality of column lines, wherein a first column line of the plurality of column lines is coupled to a first current-steering multiplexer of the plurality of current-steering multiplexers, a last column line of the plurality of column lines is coupled to a last current-steering multiplexer of the plurality of current-steering multiplexers, and each of a remainder of column lines of the plurality of column lines is coupled to two current-steering multiplexers of the plurality of current-steering multiplexers;

a plurality of current sense amplifiers, wherein each current-steering multiplexer has an output coupled to a current sense amplifier of the plurality of current sense amplifiers; and a plurality of column select signals, wherein each current-steering multiplexer of the plurality of current-steering multiplexers is coupled to a column select signal of the plurality of column select signals, wherein responsive to a given column line of the plurality of column lines having failed, the RRAM array is to set a column select signal to one of the current-steering multiplexers to a first state, and set another column select signal to another one of the current-steering multiplexers to a second state different from the first state to avoid the failed given column.

12. The RRAM array of claim 11, wherein the failed given column line is a second column line of the plurality of column lines, and wherein responsive to the second column line having failed, a first column select signal associated with a first current-steering multiplexer of the plurality of current-steering multiplexers and a first column line of the plurality of column lines is set low, and a second column select signal associated with a second current-steering multiplexer of the plurality of current-steering multiplexers and the second column line is set high to avoid the failed second column line.

13. The RRAM array of claim 11, wherein each RRAM cell is bipolar.

14. The RRAM array of claim 11, wherein each current-steering multiplexer of the plurality of current-steering multiplexers further comprises a first n-channel field-effect transistor (nFET) and a second nFET.

15. The RRAM array of claim 11, wherein each current-steering multiplexer of the plurality of current-steering multiplexers further comprises a first full pass gate and a second full pass gate.

16. The RRAM array of claim 11, wherein each RRAM cell is unipolar.

17. The RRAM array of claim 11, wherein each current-steering multiplexer of the plurality of current-steering multiplexers further comprises a first p-channel field-effect transistor (pFET) and a second pFET.

18. The RRAM array of claim 11, wherein the RRAM array is to avoid the failed given column line by applying a low column select signal to each current-steering multiplexer coupled to a column line of the plurality of column lines prior to the failed given column line, and applying a high column select signal to each current-steering multiplexer coupled to a column line of the plurality of column lines after the failed column line.

* * * * *